United States Patent [19]

Morgan

[11] Patent Number: 4,910,541
[45] Date of Patent: Mar. 20, 1990

[54] LIGHT SQUARE PROJECTOR FOR USE IN PASTING ADHESIVELY-WAXED PRINTED PIECES UPON A LAYOUT SHEET

[76] Inventor: Thomas Morgan, 170 Crystal Lake, P.O. Box 3918, Big Bear Lake, Calif. 92315

[21] Appl. No.: 277,774
[22] Filed: Nov. 30, 1988
[51] Int. Cl.$^4$ .............................................. G03B 21/00
[52] U.S. Cl. ........................................ 353/28; 353/62; 353/42; 33/613
[58] Field of Search ...................... 353/28, 42, 62, 122; 33/614, 617, 623, 1 G, 1 K, 615, 613

[56] References Cited

U.S. PATENT DOCUMENTS

| | | | |
|---|---|---|---|
| 1,953,299 | 4/1934 | Grant | 353/42 X |
| 2,782,528 | 2/1957 | Wastl | 353/42 X |
| 2,973,688 | 3/1961 | Bilibox | 353/62 X |
| 3,323,415 | 6/1967 | Tobias | 353/28 X |
| 3,749,485 | 7/1973 | Carter | 353/62 |

*Primary Examiner*—Harry N. Haroian
*Attorney, Agent, or Firm*—LaForest S. Saulsbury

[57] ABSTRACT

A manipulable device for projecting a horizontally-extending straight square edged light bar images upon a paper work sheet to facilitate the pasting of small adhesively-waxed printed pieces or strips to be placed upon a paper work sheet lying upon the base support of the device. The selected locations are determined and effected by relative fore and aft adjustment between a light bar projecting fixture and its base support with the work sheet thereon. Since procedure of pasting up of printed pieces upon a layout sheet can be done without the usual T-square and triangle, both hands are left free to carry out the pasting operation. Vertical guides are effected as vertical interferences of the projecting light rays and registerable upon the layout sheet along with the horizontally-extended light bar. Vertical and horizontal measuring rulers are provided upon the layout sheet base support to which reference can be made when locating the projected straight edge light bar upon the layout sheet.

5 Claims, 2 Drawing Sheets

LIGHT SQUARE PROJECTOR FOR USE IN PASTING ADHESIVELY-WAXED PRINTED PIECES UPON A LAYOUT SHEET

This invention relates to a light-projection device adapted for use in pasting up small printed pieces of paper upon a base sheet to provide a layout for use with printing equipment and multiple production of the final layout.

Heretofore, the layout of small printed pieces has been done with a T-square and triangle placed over the layout work sheet on a straight-edged board. The handling of these implements has been awkward, tedious and time-consuming. Inaccuracies have resulted from having to manipulate the T-square and triangle and having to excactly place the small pieces in their proper selected locations on the layout sheet. The hands are not left free to work with the laying of the small pieces as these mechanical tools are in the way and interfere much with the procedure.

The small printed pieces are adhesively waxed in advance for adherence to the layout sheet that makes for much difficulty in the handling of the small pieces particularly if the T-square and triangle is allowed to move at the instant of fixing the small pieces to the sheet. In order that the printed pieces will be straight, properly centered and aligned correct and not in random alignment upon the sheet, both hands are needed to properly affix such small printed piece upon the layout sheet. Also edges of the T-square and triangle if kept in location, are in the way and interfere so that small pieces with the wax adhesive on the backs of them get snagged to the edges of these tools and have to be stripped from the tool to finally locate them upon the work sheet only to again be stuck to the tools and have to be separated again. This prior procedure has been done usually on a lighted table with the work sheet being made translucent which also makes for confusion by having to look upon the lighted sheet.

It is, therefore, the principal object of the present invention to provide a device for pasting and laying small pieces of printed data and the like upon layout sheets without the need of a T-square, triangle or translucent lighting to interfere with the pasting procedure, thus leaving both hands free for the handing of the adhesively-waxed printed pieces.

It is another object of the invention to provide a device that will project lines of light upon a layout sheet with reference to which small adhesively-waxed pieces of printed data and the like may be aligned when pasting the waxes pieces upon the work sheet.

It is still another object to provide a light line projecting device for the pasting of small paper pieces upon a work layout sheet in which both horizontal and vertical light lines can be adjusted to any desired location on the work sheet to designate the location upon the work sheet where the particular small work piece is to be pasted.

GENERAL STATEMENT

According to the present invention, measured bars of light are simply adjusted over the layout sheet. A horizontal bar of light is moved by merely adjusting a turn knob or hand-pivoting the fixture that can move the light bar down the work sheet to work against, starting from the top as you proceed with pasting down the sheet. A vertical break in bar of light upon the work sheet provides a guide for proper vertical alignment of the printed pieces. Several vertical breaks can be provided along the projected light bar imposed upon the work sheet. Measuring rulers are provided, one across the top of the work sheet supporting platform serving as the base of the device and the other ruler along one side edge thereof, against which measurements can be taken and so that the projected light bars can be placed at measured locations upon the work sheet. The light bars will now provide the straight edge guides by which paste-up, layout and negative strip-applying procedures can be carried out in the printing industry.

The device will also be useful to architects, graphic artists, draftsmen and anyone requiring straight edges on a work layout sheet against which to work with small pieces. One can work at the layout and handle the small pasted piece without concern of a T-square and triangle to interfere with the full view of the work sheet and without need for drawing pencil or grid lines upon the work sheet. Since the layout of the work sheet is done without pencil lines, there is no need for erasures. Thus, much time is saved in the carrying out of layout work by such procedure that has been made possible by the present invention.

DETAILED DESCRIPTION

Figure 1:
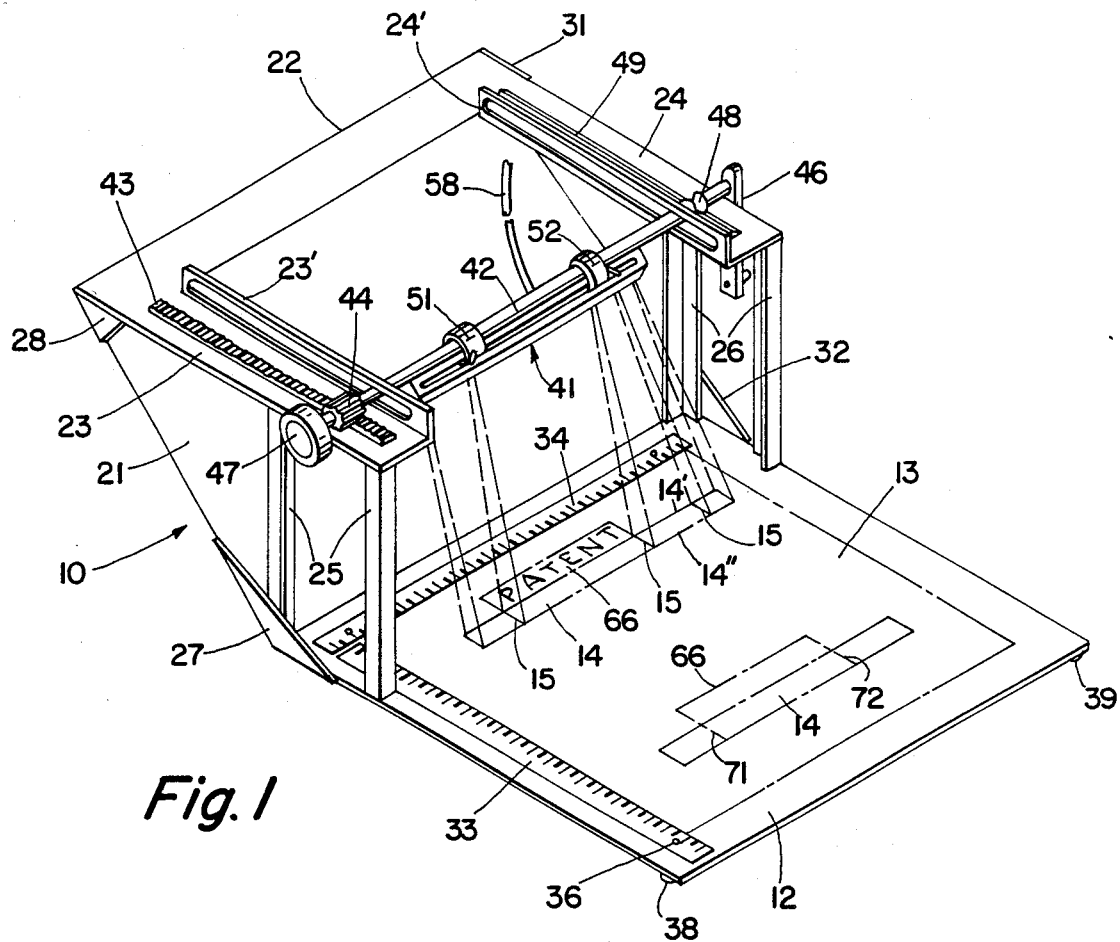
Figure 2:
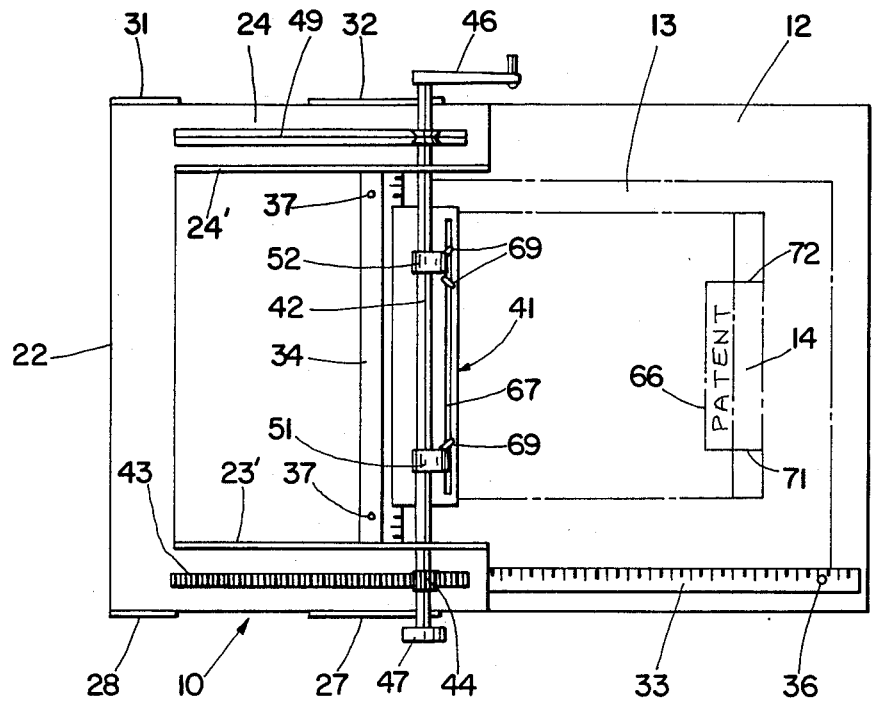
Figure 3:
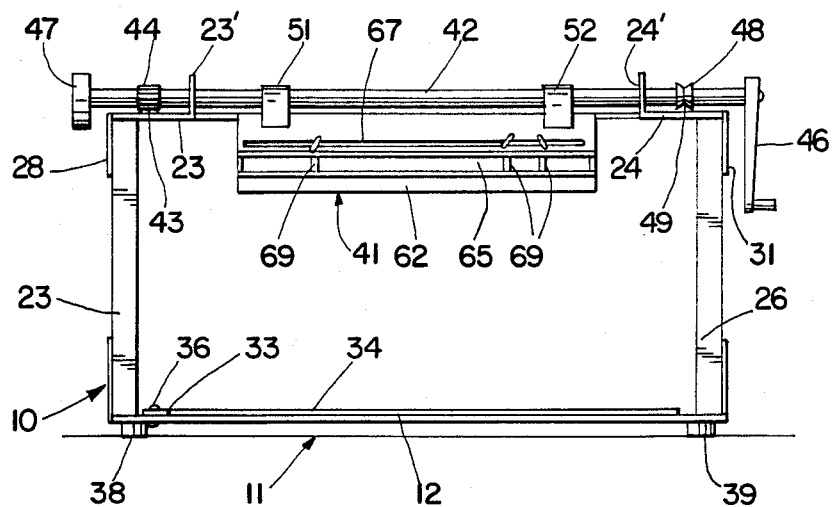
Figure 4:
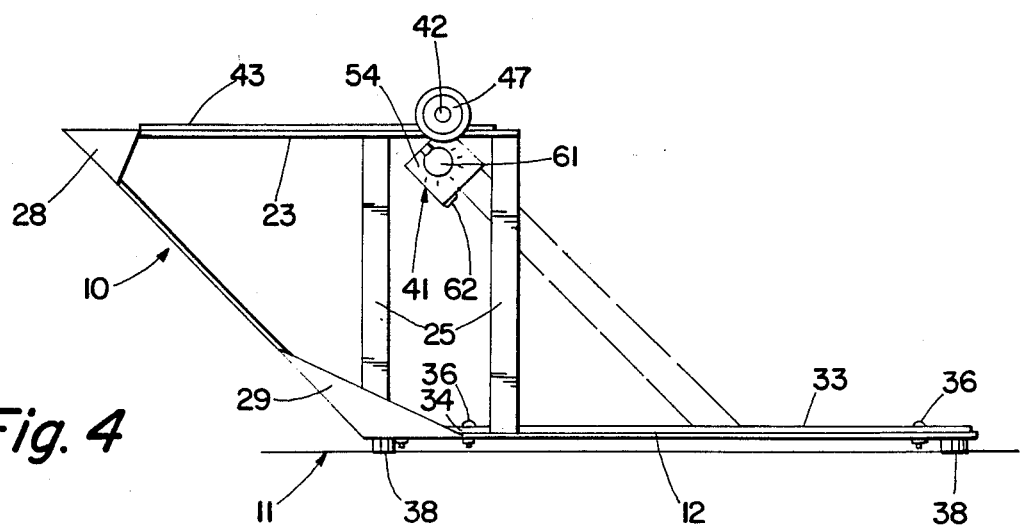
Figure 5:
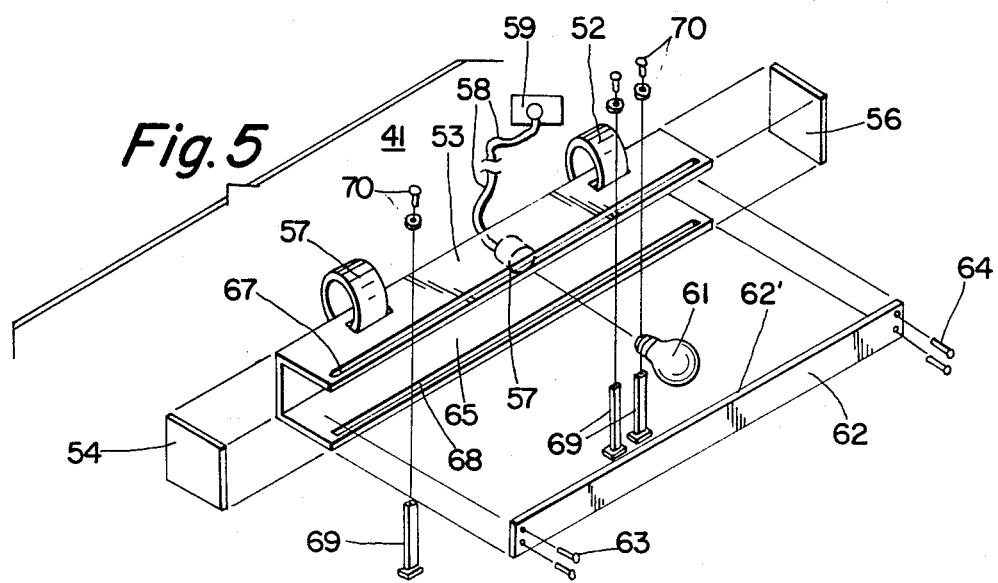

For a better understanding of the invention, reference may be had to the folowing detailed description taken in connection with the accompanying drawing, in which FIG. 1 is top and side perspective view of the light-projecting layout sheet pasting up device embodying the features of the present invention, FIG. 2 is a top plan view, FIG. 3 is a front elevational view, FIG. 4 is a side elevational view, and FIG. 5 is exploded perspective view of the light bar projecting fixture Referring now to the figures, 10 represents the present light bar projecting device in its entirety that is rigid and self-supporting and can be placed upon any flat top surface 11 or table and worked at. This device 10 has a flat base support portion or platform 12 on which a work layout sheet 13 is placed for the projection thereon of a elongated horizontal light bar 14 and with vertical light breaks 15 to serve as marginal and intermediate guide lines of the projected light or bar-shaped image 14 with sharp straight parallel top and bottom edges 14' and 14". Extending upwardly and rearwardly from the rear of the base support portion 12 is an inclined rear bent-up portion 21 that is, in turn, bent forwardly from its upper extent at 22 to provide laterally spaced forwardly-extending horizontal top support portions 23 and 24, the forward ends of which are supported by opposing pairs of vertical metal supports 25 and 26 extending upwardly from the base portion 12. The base, rear and forward support portions are of one piece of metal and the vertical supports 25 and 26 are separate pieces fixed at the support portions. Side gussets 27 and 28 are fixed to one side of the portions and side gussets 31 and 32 are fixed to the opposite side. The vertical supports 25 and 26 are of angled section.

To facilitate the placing of the basic work sheet 13 upon the base portion 12 longitudinally and laterally-extending rulers 33 and 34 are respectively secured to the base portion by small screw assemblies 36 and 37 along the left side edge and across the top of the base portion 12. These rulers 33 and 34 are extended at right angles to one another. The work sheet 13 will be easily centered by placing the upper and side edges of the sheet into the intersection of the rulers.

On the under face of the base portion 12 at the respective left and right sides thereof are depending foot members 38 and 39 by which the device is rested upon table surface 11, FIGS. 3 and 4.

The spaced forwardly-extending portions 23 and 24 serve to support a light-projecting fixture indicated generally at 41 and mounted thereon for fore and aft adjustment to vary the location for the dispersion of the horizontal light-bar image 14 upon the work sheet 13. To effect the fore and aft adjustment of the light bar image 14, a transverse shaft 42 is extended between and over the forwardly-extending spaced portions 23 and 24 and through longitudinal slots in respective upturn side edges 23' and 24' thereof. On the left forwardly-extending portion 23 is a longitudinally-extending rack gear 43 along which a pinion 44 on shaft 42 travels as the shaft 42 is turned either fast by a crank 46 at one end of the shaft 42 or by a more slow turn knob 47 fixed to the other end of the shaft 42.

The right end of the shaft 42 is grooved at 48 to run along a guide track 49 to hold the shaft 42 against axial displacement from the top of the side portions 23 and 24 while the slotted turned up edges 23' and 24' through which shaft 42 passes will hold the shaft against vertical displacement from the side portions 23 and 24.

The light fixture 41 is pivotally carried on the transverse shaft 42 for fore and aft frictionally restrained adjustment thereon and by two spaced straps 51 and 52 that extend from a top corner edge of channel-shaped member 53, open at its ends and one side. The fixture 41 is thus depended from the shaft 42 and will keep its vertical position as the shaft 42 is rotated in its straps 51 and 52 to keep its open side always open to cast the bar 14 of light upon and straight across the work sheet 13 in the position to which the light fixture has been adjusted upon the forwardly- extending portions 23 and 24. Once the shaft is adjusted to a fore and aft position on the forwardly-extending portions 23 and 24, the fixture 41 itself can be pivotally adjusted fore and aft to a position upon shaft 42 to locate the light bar 14 upon the sheet 13 at the desired location.

The open ends of the channel-shaped member 53 are respectively closed by respective end plates 54 and 56 fixed thereto. Fixed centrally to the back of the channel-shaped member 53 is a light bult socket 57 from which a current supply cable 58 will extend to a wall receptacle 59, FIG. 5. A light bulb 61 fits the socket 57 so as to fill the fixture 41 with light rays which are projected through open front face 65 of the channel-shaped member 53. To narrow the light bar 14 that is projected upon the work sheet 13, a front piece 62 is extended across the open front face 65 of the channel-shaped member 53 and secured between the end pieces 54 and 56 by screws 63 and 64 thereby reducing the height of the light-projected opening of the open face 65 of the channel-shaped member 53. The sharp straight edge of the front piece 62 is thus provided to make for a straight light bar image 14 upon the work sheet 13 to provide the straight edges 14' and 14" against either of which a small printed work piece or strip 66 is targeted, the same having been previously adhesively waxed and made ready for attachment.

Accordingly, the light bar image 14 provides a top light edge 14' and a bottom light edge 14" with either of which printed work piece 66, that will have had wax adhesive applied to its underface, can be stretched and horizontally aligned for final fixing to the layout work sheet 13, all without the need of a T-square or triangle. The procedure of the pasting of printed paper pieces 66 is done by using the bar image 14 projected upon the sheet 13. This image 14 will have been adjusted to a desired location where the pasting operation is to be effected, and the procedure carried out all without the need of an interfering T-square, triangle, pencil line or graph paper. The printed paper piece 66 can be of a width to be aligned within the light bar area 14 and upon the lighted straight edges 14' and 14" thereof.

In order to provide vertical guide lines upon the layout sheet 13, the channel-shaped member 53 is provided with upper and lower opposing slots 67 and 68 in its respective top and bottom portions through which headed pins 69 are held in place by fastening screw and washer means 70, extending to make light breaks 71 and 72 from the front face opening 65 and upon the light bar image 14 and against which the ends of the small printed pieces 66 may be aligned. These vertical guide lines 71 and 72 from the pins 69 would appear at the same transverse locations 15 once fixed in place across the slots 67 and 68 regardless of the adjustment of the light fixture 41 with and on the shaft 42. The setting of the pins 69 will be made with reference to measurement on the transverse ruler 34. The horizontal light bar image 14 will be adjsuted with reference to longitudinally-extending ruler 33. The vertical guide lines 71 and 72 will always stay in the proper position as the light bar image 14 is moved up and down the layout sheet 13.

In use, this light bar-projecting device for the pasting of "adhesively waxed" printed pieces or strips 66 will have been placed upon a flat top table surface 11 and the light cord 58 connected with wall outlet receptacle 59. By access to the front of the device a layout work sheet 13 is simply placed upon the base portion 12 and centered within the longitudinally and laterally-extending rulers 33 and 34. A light bar 14 will be projected upon the layout sheet 13 at either a lowered or a raised location depending upon the fore and aft adjustement of the light projecting fixture 41 either by the turning of the fixture upon the transverse support shaft 42 or by effecting the rotation of the shaft 42 by the crank handle 46 or turn knob 47 to drive the shaft pinion 44 over the fixed rack gear 43. The bodily movement of the shaft 42 and the fixture 41 is guided against axial displacement by the guide track 49 and against vertical displacement by the slotted turned up side portions 23' and 24' of the respective forwardly-extending top support portions 23 and 24.

It should now be apparent that with the bent-up portion 21 extending upwardly and rearwardly from the rear edge of the layout sheet support base portion 12 and the light fixture 41 being confined upon the spaced forwardly-extending portions 23 and 24 thereof that the light fixture will always be rearwardly removed from vertical space above the layout sheet 13 and base portion 12 and provides working clearance for the pasting of the pieces 66 upon the work sheet 13. The layout sheet 13 is fully exposed and adequate head room is provided for doing the pasting of the waxes printed pieces upon the layout sheet 13 and out of the way of the light fixture 41 and its adjustable supporting parts. The light rays for producing the light bar 14 are always inclined downwardly and forwardly onto the layout sheet 13.

It should also be apparent that without the presence of the usual T-square and triangle to be manipulated;

that these small waxed printed pieces or strips 66 can be pasted in place without accidental adherence of the printed pieces to the T-square and triangle. With such implements out of the way, the pasting operation can be performed simply in a non-tedious manner, and also without need for penned lines or graph paper, with both hands and a minimum chance for inaccuracies. Also, translucent lighting through a work sheet is no longer needed for this pasting procedure. The light is supplied from above rather than from underneath the work sheet.

While various changes may be made in the detail construction, it shall be understood that such changes shall be within the spirit and scope of the present invention as defined by the appended claims.

What is claimed is:

1. A light square projector for use in pasting up adhesively-waxed printed paper pieces upon a layout work sheet to serve for multiple reproduction of a final layout comprising a base portion serving as a support for a layout work sheet, a light fixture so constructed as to disperse a horizontally-extending light bar image upon the work sheet and having parallel straight sides against which the adhesively-waxes printed pieces are aligned and support means extending upwardly and rearwardly from the base portion removed from and free of the vertical work space above the layout sheet upon the base portion and means for mounting the light fixture upon the support means for fore and aft adjustment while directing the light bar image upon the layout work sheet rearwardly removed therefrom.

2. A light square projector for use in pasting up adhesively-waxed printed paper pieces upon a layout work sheet to serve for multiple reproduction of a final layout as defined in claim 1 and said fixture mounting means including a transverse member to which the light fixture itself is frictionally pivotally attached for fore and aft adjustment thereon.

3. A light square projector for use in pasting up adhesively waxed printed paper pieces upon a layout work sheet to serve for multiple reproduction of a final layout as defined in claim 2 and said transverse light fixture, supporting member being in the form of a rotatable shaft, a rack gear extending fore and aft upon the support means, a gear pinion on the shaft engageable with the rack gear, a guide track for retaining the shaft against axial displacement upon being rotated and hand grip means upon the shaft by which turning of the shaft is effected.

4. A light square projector for use in pasting up adhesively-waxed printed paper pieces upon a layout work sheet to serve for multiple reproduction of the final layout as defined in claim 1 and said support means for the light fixture being inclined upwardly and rearwardly bent from the base portion removed from and free of the vertical work space above the layout sheet and base portion, said support means further including laterally-spaced support portions forwardly bent from bent up base portion and said transverse member with the light fixture extending between said spaced forwardly-extending portions, whereby the light bar image will be imposed upon the work layout sheet from the rear of the base portion and the vertical work space thereover.

5. A light square projector for use in pasting adhesively waxed printed paper pieces upon a layout work sheet to serve for use in multiple reproduction of a final layout as defined in claim 4 and said forwardly-extending laterally-spaced support portions having opposed elongated rearward-extendng guide slots, and a transverse member being in the form of a rotatable shaft extending through the guide slots on the spaced support portions, said rack gear extending fore and aft on one of the spaced support portions and a guide track extending fore and aft on the other space portion, a pinion gear on the shaft meshing with the rack gear to effect the fore and aft adjustment of the shaft and the light fixture, and said shaft grooved to run over the guide track to maintain the shaft against axial displacement from the gear rack, and said hand grip means including a hand crank upon one end of the shaft and a hand knob upon the opposite end of the shaft.

* * * * *